United States Patent [19]

De Givry

[11] Patent Number: 5,473,196

[45] Date of Patent: Dec. 5, 1995

[54] SEMICONDUCTOR MEMORY COMPONENT COMPRISING STACKED MEMORY MODULES

[75] Inventor: Jacques De Givry, Les Loges en Josas, France

[73] Assignee: Matra Marconi Space France, Paris, France

[21] Appl. No.: 190,551

[22] Filed: Feb. 2, 1994

[30] Foreign Application Priority Data

Feb. 2, 1993 [FR] France .................................. 93 01100

[51] Int. Cl.⁶ .................... H01L 23/48; H01L 29/44; H01L 29/52; H01L 29/60
[52] U.S. Cl. .................... 257/786; 257/690; 257/692; 257/773; 257/777; 257/776; 257/784
[58] Field of Search ................................ 257/686, 692, 257/777, 786, 690, 773, 784, 776

[56] References Cited

U.S. PATENT DOCUMENTS 5,239,447  8/1993  Cotues et al. ............................ 257/686

FOREIGN PATENT DOCUMENTS

| 59-043553 | 3/1984 | Japan | 257/777 |
| 62-145764 | 6/1987 | Japan | 257/786 |
| 01081253 | 3/1989 | Japan | 257/786 |
| 03025419 | 2/1991 | Japan | 257/786 |
| 03237742 | 10/1991 | Japan | 257/786 |
| 05129366 | 5/1993 | Japan | 257/786 |

Primary Examiner—Rolf Hille
Assistant Examiner—T. M. Arroyo
Attorney, Agent, or Firm—Larson and Taylor

[57] ABSTRACT

A memory component has a rectangular semiconductor substrate containing active memory circuits and output terminals on a major surface thereof. An insulating layer on the major surface receives a plurality of metal connection leads, connecting the output terminals to connection pads located on the major surface along only one of longer sides of the substrate. A plurality of additional pads are distributed between the connecting pads and are devoid of connection leads. A memory module comprising several stacked memory components is also described, which uses the additional pads as relays.

9 Claims, 1 Drawing Sheet

SEMICONDUCTOR MEMORY COMPONENT COMPRISING STACKED MEMORY MODULES

BACKGROUND OF THE INVENTION

The invention relates to high capacity storage devices as used in computer systems.

A major application lies in solid-state recorders, that are tending to replace electromagnetic recorders, given the limitations thereof and the appearance of highly integrated storage components, exceeding 1 Mbits for static memory and 4 Mbits for dynamic memory.

There are numerous applications in which the space occupied must be as small as possible. Often, it is also desirable to reduce weight for a given capacity. This applies in particular for equipments designed for space vehicles and satellites.

Proposals have already been made (EP-A-0 489 643) to reduce the volume and the weight of a semiconductor memory device by stacking elongated components having their outputs located at their ends, and by disposing pairs of superposed components in a crossed configuration. By crossing two superposed components, it is possible to gain access to their outputs in order to solder the connection wires thereto.

However, large capacity memory components or "chips" (4 Mbits and above) that are available or have been announced are often provided with output terminals that are not disposed at their ends, but that are disposed over the entire margin of a major facet, or even along the middle axis which is parallel to the longer side of a major facet. And even when the terminals are at the ends, the ratio between the length and the width of such components is often insufficient to gain easy access to their output terminals by crossing the components.

A component is also known (WO-A-91 00683) in which the major fraction of the linking leads are placed elsewhere than over the active zone, thereby requiring considerable semiconductor area and bulk.

SUMMARY OF THE INVENTION

It is an object of the invention to provide a large capacity memory component enabling a plurality of components to be stacked while keeping open the option of connection to an interconnection support. For this purpose, the invention provides a memory component having: a rectangular semiconductor substrate containing active memory circuits and having output terminals on a major surface thereof; an insulating layer on said major surface; a plurality of metal connection leads on said insulating layer, connecting said output terminals to connection pads located on said major surface along only one of longer sides of said substrate; a plurality of additional pads may be distributed between said connecting pads and are devoid of connection leads. Typically, the metal connecting leads are only located above a zone of said substrate containing active memory circuits. Said connecting metal leads connecting said output terminals to a plurality of connecting pads located on said major surface along only one of longer sides of the substrate. A memory module may comprise a plurality of components of the above-defined type on an interconnection support, all components having the same elongated shape, with two successive components being stacked while in the same orientation and being offset one relative to another in such a manner and by such an amount that the connection pads of one component are out of the component placed above it in the stack.

It is generally preferable to give the substrate of the component a width such that the connection areas are disposed outside the zone containing active circuitry, thereby avoiding damage to the active circuitry when bonding flexible connection wires to said pads. In practice, in order to achieve this result, an increase in width of about 1 mm suffices. This increase does not change manufacturing yield, and it reduces the number of components that can be manufactured on a semiconductor wafer only slightly.

Nevertheless, certain wire bonding methods, in particular that known as "wedge bonding", make it possible to accept connections directly over the active zone.

Additional areas, in addition to the connection areas connected to terminals and distributed amongst the pads may be used as relay points for facilitating wiring between the stacked components and/or with the support.

The invention will be better understood from the following description of particular embodiments given as examples. The description refers to the accompanying drawing:

DETAILED DESCRIPTION

Figure 1:
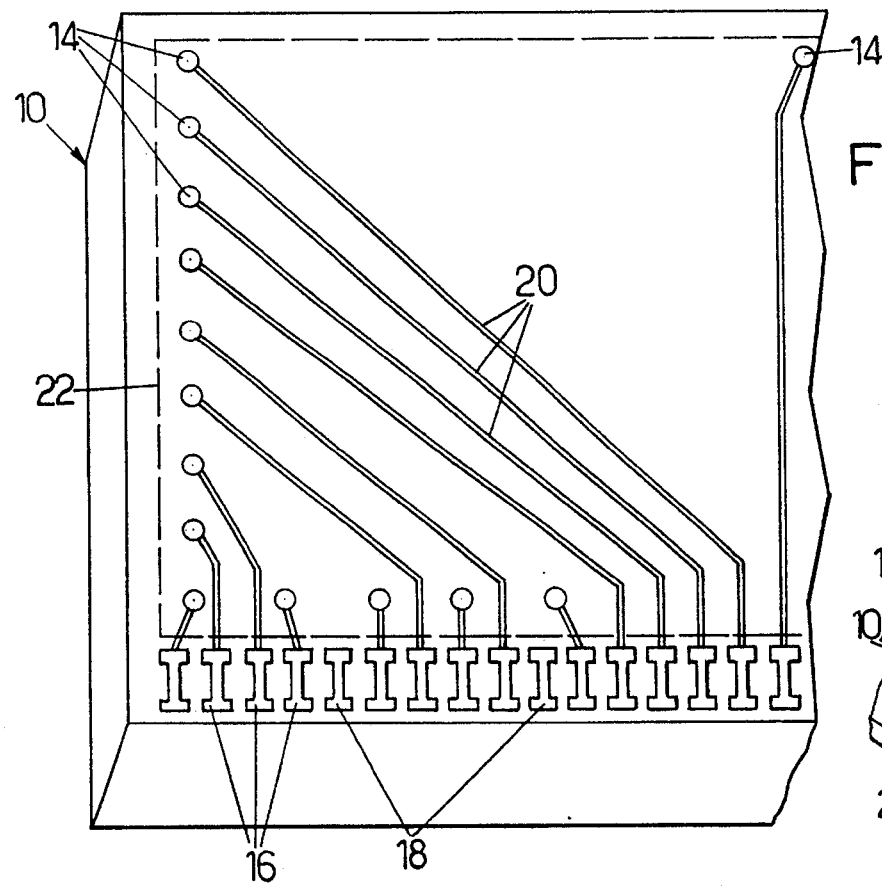
FIG. 1 is a theoretical diagram showing that one of the major surfaces of a memory component which carries output terminals, in a particular embodiment of the invention (the Figure is at scale for greater clarity)

The component 10 having a fraction thereof shown diagrammatically in FIG. 1 constitutes a memory chip that is elongated in shape, and that carries terminals 14 on one of its major surfaces, the terminals being distributed over its four sides. The invention is also applicable to a component having a different distribution of output terminals, e.g. a distribution along the middle lines of the major surface that is lengthwise. The output terminals 14 are connected to respective interconnection pads 16 that are regularly distributed along a single one of the longer sides of the face. In the embodiment shown, additional pads 18 (not connected to terminals) are distributed amongst and aligned with the pad 16.

The connections or routes between the terminals 14 and the pads 16 may be implemented by well-known techniques that are in wide-spread use for making multi-chip modules (MCMs). On the substrate-constituting silicon of the component, a dielectric insulating layer of a material that is generally organic, such as a polyamide, is initially deposited, after which link tracks or leads 20 are formed, generally by metal plating and by photoetching. If it is desired to achieve routing in a single layer, at a low cost, then it is desirable to avoid having tracks that cross one another. Nevertheless, multi-layer routing may be used when necessary, e.g. if it is necessary to provide a local ground plane to reduce interfering cross-talk.

In the embodiment as shown, the pads 16 and 18 are deposited along a rim of the substrate lying outside its active zone, which is represented in FIG. 1 by a dashed outline frame 22.

The usual length of a large capacity memory chip (typically 15 mm to 20 mm) leaves room for a maximum of about 40 connections, as are required, and also leaves room for one additional connection pad 18 for two to five pads 16. Present methods of soldering a fine wire of gold or aluminium (25 mm or 38 µm) make it possible to reduce the pitch thereof to 100 µm–150 µm.

Each of the pads 16 and 18 shown has two enlarged bonding portions, one of which terminating a track for each pad 16. However, other configurations are possible, and in particular each pad may be longer than those shown and may include more than two connection zones.

Figure 2:
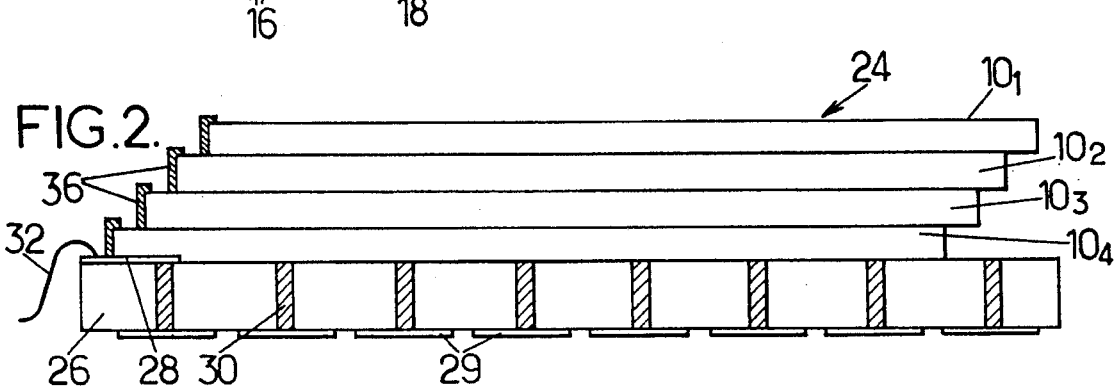
FIG. 2 is a diagrammatic elevation view of a module comprising four stacked components.

Components of the kind described above can be used for building up memory modules by stacking several components in the same orientation, while simultaneously offsetting each component sufficiently to enable the connection pads of one component to project beyond the component placed above it. The module 24 shown diagrammatically in FIG. 2 includes an interconnection support 26 (typically of alumina) and a stack of four components $10_1$, $10_2$, $10_3$ and $10_4$. The support 26 may carry conductors 28 on a side portion of that of its major surfaces which receives the component $10_4$, which conductors may be made using gold and thick film technology. The conductors 28 constitute relays between the components and the outside. The component 104 is set back relative to the edge of the support so that the conductors 28 are accessible over a width of about the same size as the offset between successive components. The support may also carry conductors 29 on its other surface. Connections may be made between the conductors 28, 29 through the support 26 by means of plated through holes 30.

Present technology makes it possible without difficulty to obtain conductors 28 about 150 µm wide, for example, on the surface that receives the component 104. The conductors 29 make it possible, in particular, to obtain test pads that are accessible.

The connections between the module and the outside may be established via flexible wires 32 bonded to the conductors 28. Lengths of connecting wire can be installed using methods that are already known, and in particular using the methods described in prior patents assigned to the assignee of the present Application.

Figure 4:
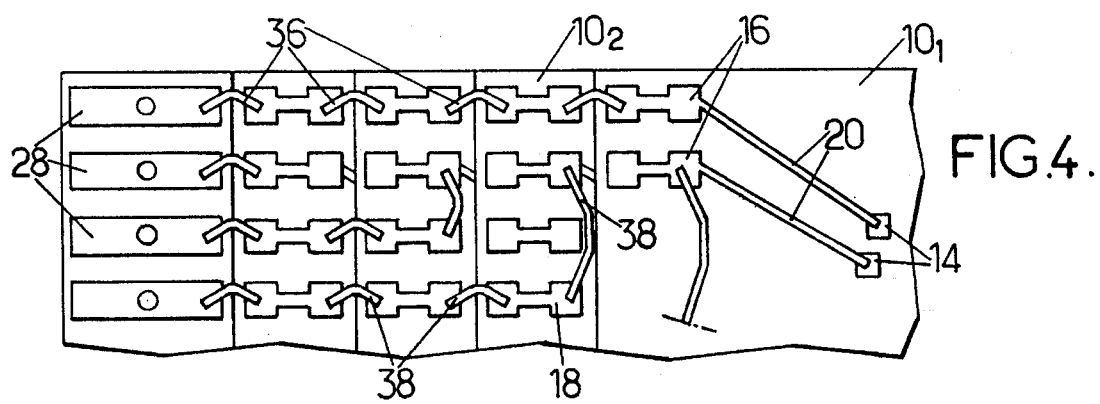
FIG. 4 is a detailed view, on an enlarged scale, showing one possible way in which relay areas may be used for making interconnections.

The connections linking one component to another, and linking the component $10_4$ to the substrate may be implemented simply by using short lengths of insulated wire. The common power supplies and inputs/outputs can then be chained together between the components and the support, assuming that the components are memory chips. The junctions 36 in FIG. 4 constitute examples of such chain connections. Specific inputs and outputs are very small in number and can be wired in simple manner while avoiding any direct connection between a component and the outside, by making use of relay pads 18, e.g. as represented by junctions 38 in FIG. 4.

Although the material that appears, at present, to be most appropriate for the support 26 is alumina or a ceramic of the same kind, other materials may be envisaged, as long as the thermal expansion coefficients of the components and of the support are comparable and providing the support has sufficient thermal conductivity to dump heat. In particular, it is possible to use supports that are organic. The components $10_1$, ..., $10_4$ may be secured to one another and to the support 26 by means of pellets of glue deposited by silk-screen printing or by means of a stamp or in the form of a dry film that guarantees constant thickness. The amount of overhang of each component relative to the component beneath it always remains small enough to ensure that the heat-removal path is not significantly lengthened.

The support 26 is not necessarily a small substrate: it is also possible to use a hybrid substrate carrying other components.

Figure 3:
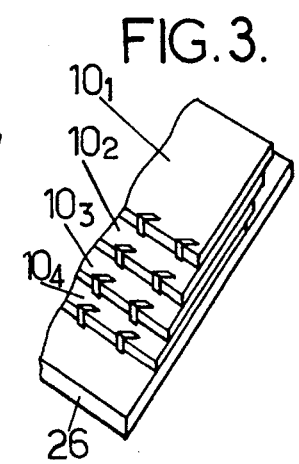
FIG. 3 is another diagram showing a perspective view of a fraction of a module.

The invention makes it possible, in particular, to make up memories of very large capacity. As an example, modules have been made up by assembling together four DRAM memory chips each of a capacity of 16 Mbits on a thick film support, and occupying less than 20 mm×15 mm. Another implementation comprises eight modules of the kind shown in FIG. 2 to 4 on each surface of a two-face ceramic support. Such supports may be provided with metal sealing caps. It is thus possible to make up mass memory having a capacity of about 20 Mbits/gram.

I claim:

1. Memory component having: a rectangular semiconductor substrate containing active memory circuits and having output terminals on a major surface thereof; an insulating layer on said major surface; a plurality of metal connection leads on said insulating layer, said metal connection leads connecting said output terminals to connection pads located on said major surface along only one of longer sides of said substrate; and a plurality of additional pads which are distributed between said connection pads and are devoid of connection leads, said substrate having such a width that said connection pads are beyond a zone of said substrate which contains active memory circuits.

2. Memory component having: a rectangular semiconductor substrate containing active memory circuits and carrying output terminals on a major surface thereof; an insulating layer on said major surface, metal connecting leads located on said insulating surface and all located above a zone of said substrate containing active memory circuits, said metal connection leads connecting said output terminals to a plurality of connection pads located on said major surface along only one of longer sides of the substrate.

3. Component according to claim 1, wherein said metal connection leads are devoid of mutual crossing.

4. Component according to claim 2, wherein said substrate has such a width that said connection pads are beyond the zone thereof which contains active memory circuits.

5. Memory module comprising:

an interconnection support; and a plurality of memory components, all having a same elongated shape, and all mutually stacked in a same angular position;

each said memory component having: a rectangular semiconductor substrate containing active memory circuits and having output terminals on a major surface thereof; an insulating layer on said major surface; and a plurality of metal connection leads on said insulating layer, said metal connection leads connecting said output terminals to connection pads located on said major surface along only one of longer sides of said substrate; two successive said components being mutually offset by an amount sufficient for the connection pads of one said component to be located beyond the component located above it in the stack.

6. Module according to claim 5, wherein said interconnection support carries conducting tracks on a lateral portion of a major surface thereof which receives said stack, a lowest component in the stack being offset with respect to an edge of said lateral portion.

7. Module according to claim 6, wherein said interconnection support carries additional conducting tracks on another major surface thereof opposed to said first-mentioned major surface which receives said stack, and connections are formed between said conducting tracks on said first-mentioned major surface and said additional conducting tracks by metal plated holes.

8. Module according to claim 6, further comprising connections with external circuits consisting of lengths of flexible wires bonded on said conducting tracks.

9. Memory module comprising: an interconnecting support; and a plurality of memory components, all having a same elongated shape and all mutually stacked in a same angular position;

each said memory component having: a rectangular semiconductor substrate containing active memory circuits and having output.. terminals on a major surface; an insulating layer on said major surface, a plurality of metal connection leads on said insulating layer, said metal connection leads connecting said output terminals to connection pads located on said major surface along only one of longer sides of said substrate; and a plurality of additional pads which are distributed between said connection pads and are devoid of connection leads, said additional pads constituting relays for bonding serially mounted short lengths of electrically insulated wire which constitute two successive said components being mutually offset by an amount sufficient for the connection pads and additional pads of one of said component to be located beyond the component located thereabove in the stack.

* * * * *